United States Patent
Fuse

(10) Patent No.: US 12,160,936 B2
(45) Date of Patent: Dec. 3, 2024

(54) HEAT TREATMENT APPARATUS OF LIGHT IRRADIATION TYPE AND METHOD FOR CLEANING HEAT TREATMENT APPARATUS

(71) Applicant: SCREEN Holdings Co., Ltd., Kyoto (JP)

(72) Inventor: Kazuhiko Fuse, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 627 days.

(21) Appl. No.: 16/987,458

(22) Filed: Aug. 7, 2020

(65) Prior Publication Data

US 2021/0051771 A1 Feb. 18, 2021

(30) Foreign Application Priority Data

Aug. 16, 2019 (JP) .................................. 2019-149433

(51) Int. Cl.
*H05B 3/00* (2006.01)
*H01L 21/67* (2006.01)

(52) U.S. Cl.
CPC ...... *H05B 3/0047* (2013.01); *H01L 21/67115* (2013.01)

(58) Field of Classification Search
CPC ............ H05B 3/0047; H05L 21/67115; H05L 21/6875; H05L 21/67005; H05L 21/67017;

(Continued)

(56) References Cited

U.S. PATENT DOCUMENTS 9,168,570 B2 * 10/2015 Ogawa ................. B08B 7/0057
2002/0129833 A1 * 9/2002 Drzal .................... B08B 7/0057
134/1

(Continued)

FOREIGN PATENT DOCUMENTS

CN 108292598 A 7/2018
EP 0606648 A2 * 7/1994

(Continued)

OTHER PUBLICATIONS

Office Action and Search Report dated Jun. 15, 2021 in corresponding Taiwanese Patent Application No. 109118578.

(Continued)

*Primary Examiner* — Shawntina T Fuqua
(74) *Attorney, Agent, or Firm* — OSTROLENK FABER LLP

(57) ABSTRACT

As treatment of a semiconductor wafer to be a product proceeds in a heat treatment apparatus, contaminants adhere to an inner wall surface of a chamber. After the treatment of the semiconductor wafer is completed, a gas containing ozone is supplied into the chamber to form an atmosphere containing ozone. While the atmosphere containing ozone is heated by irradiation with light from a halogen lamp, a flash lamp emits a flash of light containing ultraviolet light. The ultraviolet light decomposes ozone to generate active oxygen, and the active oxygen reacts with the contaminants to decompose and remove the contaminants from the inner wall surface of the chamber. The contaminants decomposed and vaporized are discharged out of the chamber by exhausting the atmosphere in the chamber.

8 Claims, 10 Drawing Sheets

(58) Field of Classification Search
CPC ......... H05L 21/67028; H05L 21/02041; B08B 7/0057; F27B 5/06; F27B 17/0025
See application file for complete search history.

(56) References Cited

U.S. PATENT DOCUMENTS

| | | | |
|---|---|---|---|
| 2003/0183612 A1 | 10/2003 | Timans et al. | |
| 2006/0107976 A1 | 5/2006 | Boyers et al. | |
| 2006/0180173 A1* | 8/2006 | Johnston | H01L 21/67115 134/1 |
| 2008/0302400 A1* | 12/2008 | Johnston | B08B 7/0057 134/58 R |
| 2010/0018548 A1* | 1/2010 | Yi | H01L 21/67115 134/1 |
| 2010/0096564 A1 | 4/2010 | Yang et al. | |
| 2011/0100394 A1 | 5/2011 | Yi et al. | |
| 2011/0248183 A1 | 10/2011 | Yang et al. | |
| 2012/0093492 A1 | 4/2012 | Kato et al. | |
| 2013/0167873 A1* | 7/2013 | Ogawa | A61L 2/10 134/18 |
| 2013/0315576 A1* | 11/2013 | Nishihara | H01L 21/67115 392/416 |
| 2015/0007856 A1* | 1/2015 | Jackson | B08B 7/0057 134/1 |
| 2015/0118862 A1 | 4/2015 | Reilly et al. | |
| 2016/0195333 A1 | 7/2016 | Kawarazaki | |
| 2017/0011922 A1 | 1/2017 | Tanimura et al. | |
| 2018/0144939 A1 | 5/2018 | Tanimura et al. | |
| 2018/0350595 A1* | 12/2018 | Srinivasan | H01L 21/02348 |
| 2018/0369881 A1 | 12/2018 | Saito et al. | |
| 2019/0084014 A1* | 3/2019 | Furukawa | B08B 5/00 |
| 2021/0051771 A1* | 2/2021 | Fuse | H01L 21/6875 |

FOREIGN PATENT DOCUMENTS

| | | |
|---|---|---|
| JP | H01-042129 A | 2/1989 |
| JP | H06-216175 A | 8/1994 |
| JP | 2003-512736 A | 4/2003 |
| JP | 2009-231652 A | 10/2009 |
| JP | 2010-141210 A | 6/2010 |
| JP | 2011-526077 A | 9/2011 |
| JP | 2012-506622 A | 3/2012 |
| JP | 2012-084756 A | 4/2012 |
| JP | 2013-045924 A | 3/2013 |
| JP | 2014-011256 A | 1/2014 |
| JP | 2017-017277 A | 1/2017 |
| JP | 2018-082118 A | 5/2018 |
| JP | 2019-057566 A | 4/2019 |
| KR | 10-2011-0025227 A | 3/2011 |
| KR | 10-2014-0001742 A | 1/2014 |
| KR | 10-2019-0033003 A | 3/2019 |
| TW | 201729296 A | 8/2017 |
| TW | 201822278 A | 6/2018 |
| WO | WO 2014/149862 A1 | 9/2014 |
| WO | WO 2017/136222 A1 | 8/2017 |

OTHER PUBLICATIONS

Notification of Reason for Refusal dated Dec. 9, 2021 in corresponding Korean Patent Application No. 10-2020-0101627 and machine-generated English translation obtained from the JPO.
Korean Notice of Final Rejection dated May 30, 2022 in corresponding Korean Patent Application No. 10-2020-0101627 and machine language English translation obtained from the JPO.
Notice of Final Rejection dated Sep. 5, 2022 in corresponding Korean Patent Application No. 10-2020-0101627 and computer generated English translation obtained from the Global Dossier.
Notice of Reasons for Refusal dated Mar. 22, 2023 in corresponding Japanese Patent Application No. 2019-149433 and a machine English translation obtained from the JPO.
First Office Action with Search Report dated Feb. 5, 2024 in corresponding Chinese Patent Application No. 202010639262.8 and a computer generated English translation based on a Japanese translation of the original communication.
Chinese Notification of Granting Patent Right with Search Report dated Jun. 17, 2024 in corresponding Chinese Patent Application No. 202010639262.8.

* cited by examiner

F I G . 4
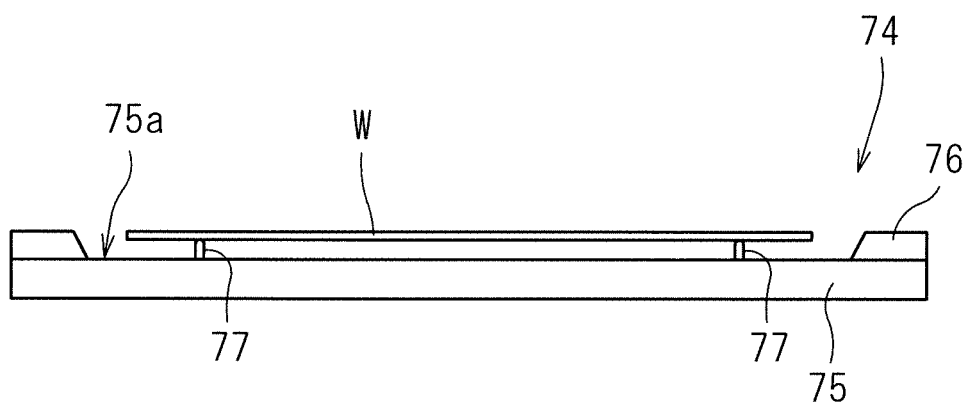

F I G . 1 0
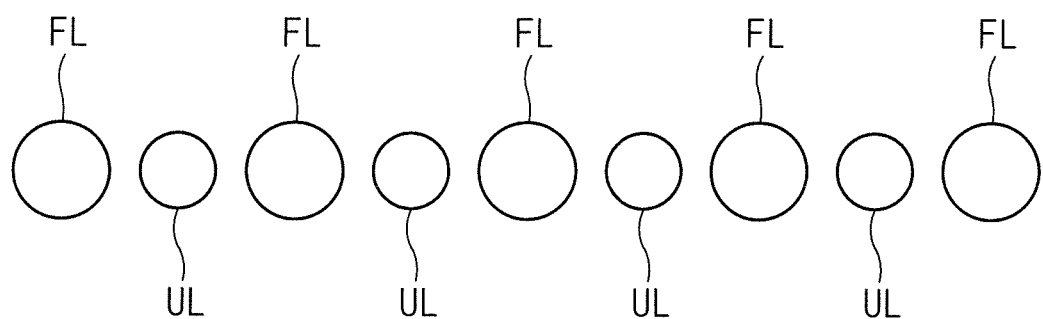

HEAT TREATMENT APPARATUS OF LIGHT IRRADIATION TYPE AND METHOD FOR CLEANING HEAT TREATMENT APPARATUS

BACKGROUND OF THE INVENTION

Field of the Invention

The present invention relates to a heat treatment apparatus for irradiating a thin-plated precision electronic substrate (hereinafter referred to as simply "substrate") such as a semiconductor wafer with light to heat the substrate and a method for cleaning the heat treatment apparatus.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a front surface of a semiconductor wafer with a flash of light, thereby raising the temperature of only the front surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. In addition, it has turned out that flash irradiation, that is, the irradiation of a semiconductor wafer with a flash of light in an extremely short time of several milliseconds or less allows a selective temperature increase only near the front surface of the semiconductor wafer.

This kind of flash lamp annealing is used for treatment requiring heating for an extremely short time, such as typically activation of impurities implanted into a semiconductor wafer. The irradiation of a front surface of a semiconductor wafer implanted with impurities by an ion implantation process with a flash of light emitted from flash lamps allows the temperature increase only in the front surface of the semiconductor wafer to an activation temperature for an extremely short time. This enables achieving only the activation of the impurities without deep diffusion of the impurities.

Flash lamp annealers have been tried not only for activating implanted impurities as described above, but also for other uses. For example, US 2018/0144939 discloses a technique in which after a film of a silicon dioxide containing dopants such as phosphorus (P) and boron (B) is deposited on a front surface of a semiconductor wafer and the dopants are diffused on the front surface of the semiconductor wafer with irradiation with light from a halogen lamp, the dopants are activated by irradiation with a flash of light.

In a technique as disclosed in US 2018/0144939, when a film containing dopants is heated, the dopants may be discharged from the film due to outward diffusion to contaminate an inner wall surface of a chamber. Depending on a type of film deposited on a semiconductor wafer, sublimates may be generated during heating to contaminate the inner wall surface of the chamber. This requires a flash lamp annealer for mass-producing semiconductor devices to be cleaned by opening the chamber at least once a month. Depending on a type of semiconductor wafer being treated, the chamber may be required to be cleaned at least once a week.

When the cleaning is performed by opening the chamber, the apparatus is naturally required to be stopped. Thus, cleaning treatment with the chamber opened may deteriorate a rate of operation of the apparatus to cause increase in production cost.

SUMMARY OF THE INVENTION

The present invention is directed to a heat treatment apparatus for irradiating a substrate with light to heat the substrate.

In an aspect of the present invention, a heat treatment apparatus includes: a chamber for accommodating a substrate; a susceptor for holding the substrate in the chamber; a continuous lighting lamp for emitting light into the chamber to heat the substrate held by the susceptor; an ultraviolet lamp for emitting light containing ultraviolet light into the chamber; and a gas supply part for supplying a gas containing ozone into the chamber, in which the ultraviolet lamp emits light containing ultraviolet light into the chamber in which treatment of the substrate is finished and an atmosphere containing ozone is provided.

Interaction of the ozone and the ultraviolet light enables contaminants in the chamber to be decomposed and removed, so that contamination in the chamber can be easily cleaned.

The ultraviolet lamp preferably emits light containing ultraviolet light while the continuous lighting lamp heats the atmosphere containing ozone.

This enables further acceleration of decomposition and removal of the contaminants.

A heat treatment recipe used for treatment of the substrate preferably coincides with a treatment recipe used for ultraviolet light irradiation treatment using a dummy substrate.

This enables treatment of the substrate to be started immediately when the treatment using the dummy substrate is performed.

The heat treatment apparatus preferably includes further an exhaust part for exhausting an atmosphere in the chamber, and the exhaust part exhausts the atmosphere from the chamber after the ultraviolet lamp emits light containing ultraviolet light.

This enables substances generated by the decomposition of the contaminants to be discharged out of the chamber.

The present invention is also directed to a method for cleaning a heat treatment apparatus for irradiating a substrate with light to heat the substrate.

In another aspect of the present invention, a method for cleaning a heat treatment apparatus includes the steps of: (a) irradiating a substrate held on a susceptor in a chamber with light to heat the substrate; (b) supplying a gas containing ozone into the chamber in which treatment of the substrate is finished; and (c) allowing an ultraviolet lamp to emit light containing ultraviolet light into the chamber in which an atmosphere containing ozone is provided.

Interaction of the ozone and the ultraviolet light enables contaminants in the chamber to be decomposed and removed, so that contamination in the chamber can be easily cleaned.

The ultraviolet lamp preferably emits light containing ultraviolet light while the continuous lighting lamp emits light into to the chamber to heat the atmosphere containing ozone.

This enables further acceleration of decomposition and removal of the contaminants.

A heat treatment recipe used for treatment of the substrate in step (a) preferably coincides with a treatment recipe used for treatment of a dummy substrate in step (c).

This enables treatment of the substrate to be started immediately when the treatment using the dummy substrate is performed.

The method preferably includes further the step of: (d) exhausting the atmosphere from the chamber after the ultraviolet lamp emits light containing ultraviolet light.

This enables substances generated by the decomposition of the contaminants to be discharged out of the chamber.

Thus, it is an object of the present invention to easily clean contamination in the chamber.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view of the susceptor;

FIG. 10 is a diagram illustrating an example of an arrangement of ultraviolet lamps.

DESCRIPTION OF THE PREFERRED EMBODIMENTS

Hereinafter, preferred embodiments according to the present invention will be described in detail with reference to the drawings.

Figure 1:
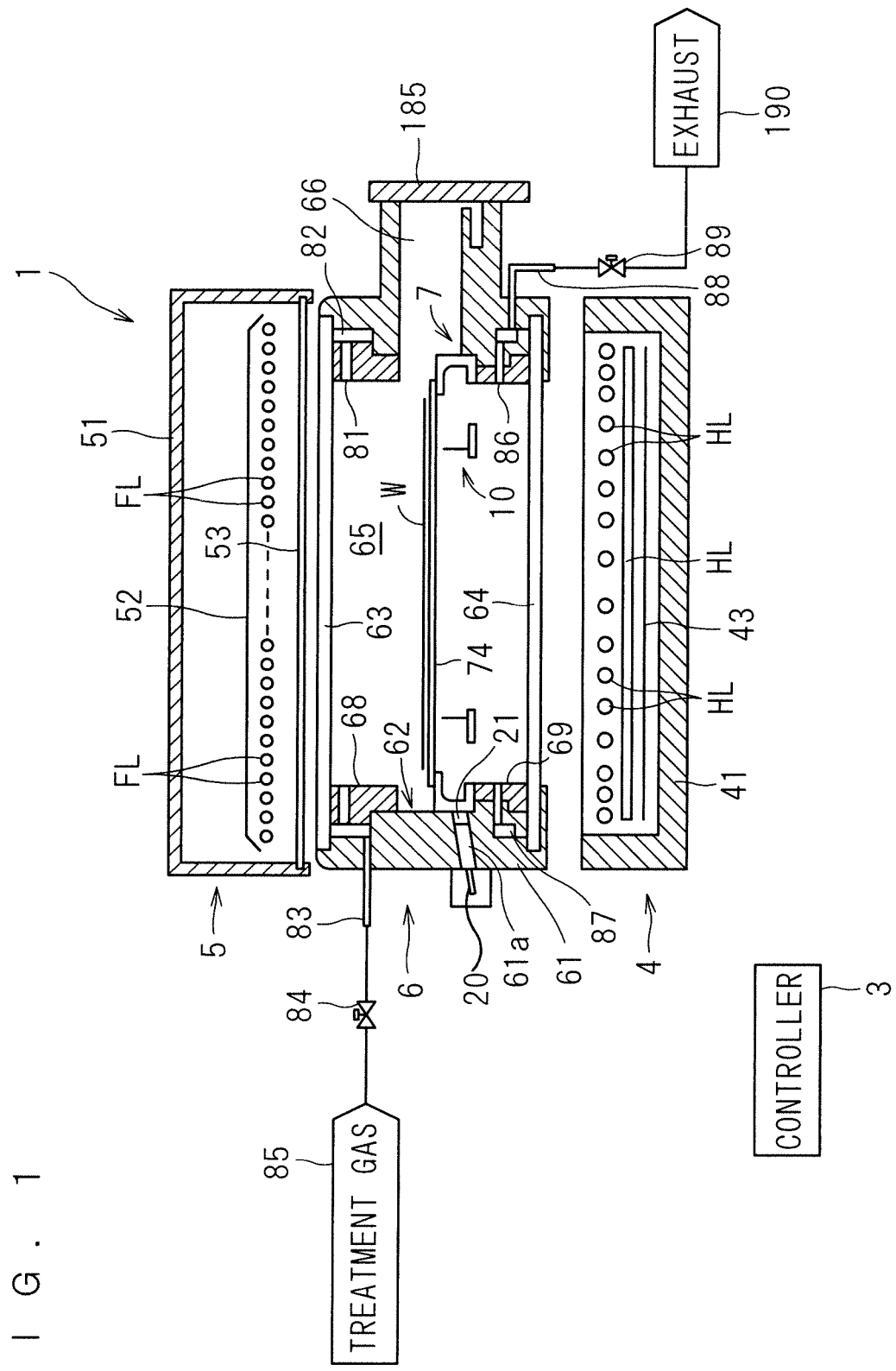
FIG. 1 is a longitudinal sectional view illustrating a configuration of a heat treatment apparatus according to the present invention.

FIG. 1 is a longitudinal sectional view illustrating a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. While a size of the semiconductor wafer W to be treated is not particularly limited, the semiconductor wafer W to be treated has a diameter of 300 mm or 450 mm, for example. FIG. 1 and the subsequent drawings show dimensions of components and the number of components in an exaggerated manner or in a simplified manner as needed to facilitate understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal orientation, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that each chamber window made of quartz is mounted to the top and bottom of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. The upper and lower reflective rings 68 and 69 are each formed in the shape of an annular ring. The upper reflective ring 68 is mounted by being inserted downwardly from above the chamber side portion 61. The lower reflective ring 69, on the other hand, is mounted by being inserted upwardly from below the chamber side portion 61 and fastened with screws (not illustrated). In other words, the upper and lower reflective rings 68 and 69 are mounted to the chamber side portion 61 in a detachable manner. An interior space of the chamber 6, i.e. a space surrounded by the upper chamber window 63, the lower chamber window 64, the chamber side portion 61, and the reflective rings 68 and 69, is defined as a heat treatment space 65.

A recessed portion 62 is defined in the inner wall surface of the chamber 6 by mounting the reflective rings 68 and 69 to the chamber side portion 61. Specifically, there is defined the recessed portion 62 surrounded by a middle portion of the inner wall surface of the chamber side portion 61 where the reflective rings 68 and 69 are not mounted, a lower end surface of the reflective ring 68, and an upper end surface of the reflective ring 69. The recessed portion 62 is formed in the shape of a horizontal annular ring in the inner wall surface of the chamber 6, and surrounds the holder 7 holding a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable by a gate valve 185. The transport opening 66 is connected in communication with an outer peripheral surface of the recessed portion 62. Thus, when the transport opening 66 is opened by the gate valve 185, a semiconductor wafer W is allowed to be transported from the transport opening 66 through the recessed portion 62 into the heat treatment space 65 and transported out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted to a location of an outer wall surface of the chamber side portion 61 where the through hole 61a is provided. The through hole 61a is a cylindrical hole for guiding infrared light emitted from the lower surface of a semiconductor wafer W held by a susceptor 74 to be described later therethrough to the radiation thermometer 20. The through hole 61a is inclined with respect to a horizontal direction so that an axis in its penetrating direction intersects a main surface of the semiconductor wafer W held by the susceptor 74. The through hole 61a is provided, at its end facing the heat treatment space 65, with a transparent window 21 made of barium fluoride material that allows infrared light in a wavelength range measurable by the radiation thermometer 20 to pass therethough.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the reflective ring 68. The gas supply opening 81 is connected in communication with a gas supply pipe 83 through a buffer space 82 formed in the shape of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing into the buffer space 82 flows in a spreading manner within the buffer space 82 that is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), or mixtures of these gases (although nitrogen gas is used in the present preferred embodiment). In addition, the treatment gas supply source 85 can feed ozone ($O_3$), oxygen ($O_2$), nitrogen trifluoride ($NF_3$), chlorine trifluoride ($ClF_3$), chlorine ($CL_2$), or the like as a cleaning gas so that the cleaning gas can also be supplied into the chamber 6 through the gas supply opening 81.

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 formed in the shape of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The pluralities of gas supply opening 81 and gas exhaust opening 86 may be provided in a circumferential direction of the chamber 6, and each may be in the shape of a slit.

The exhaust part 190 includes a vacuum pump. When the exhaust part 190 is operated to exhaust the gas in the heat treatment space 65 without supplying gas from the gas supply opening 81, the pressure in the chamber 6 can be reduced to less than the atmospheric pressure. In addition, the vacuum pump of the exhaust part 190 and the gas exhaust pipe 88 are connected by, for example, three bypass lines different in pipe diameter, so that a flow rate of exhaust gas and exhaust velocity from the chamber 6 can be changed by opening any one of the bypass lines.

Figure 2:
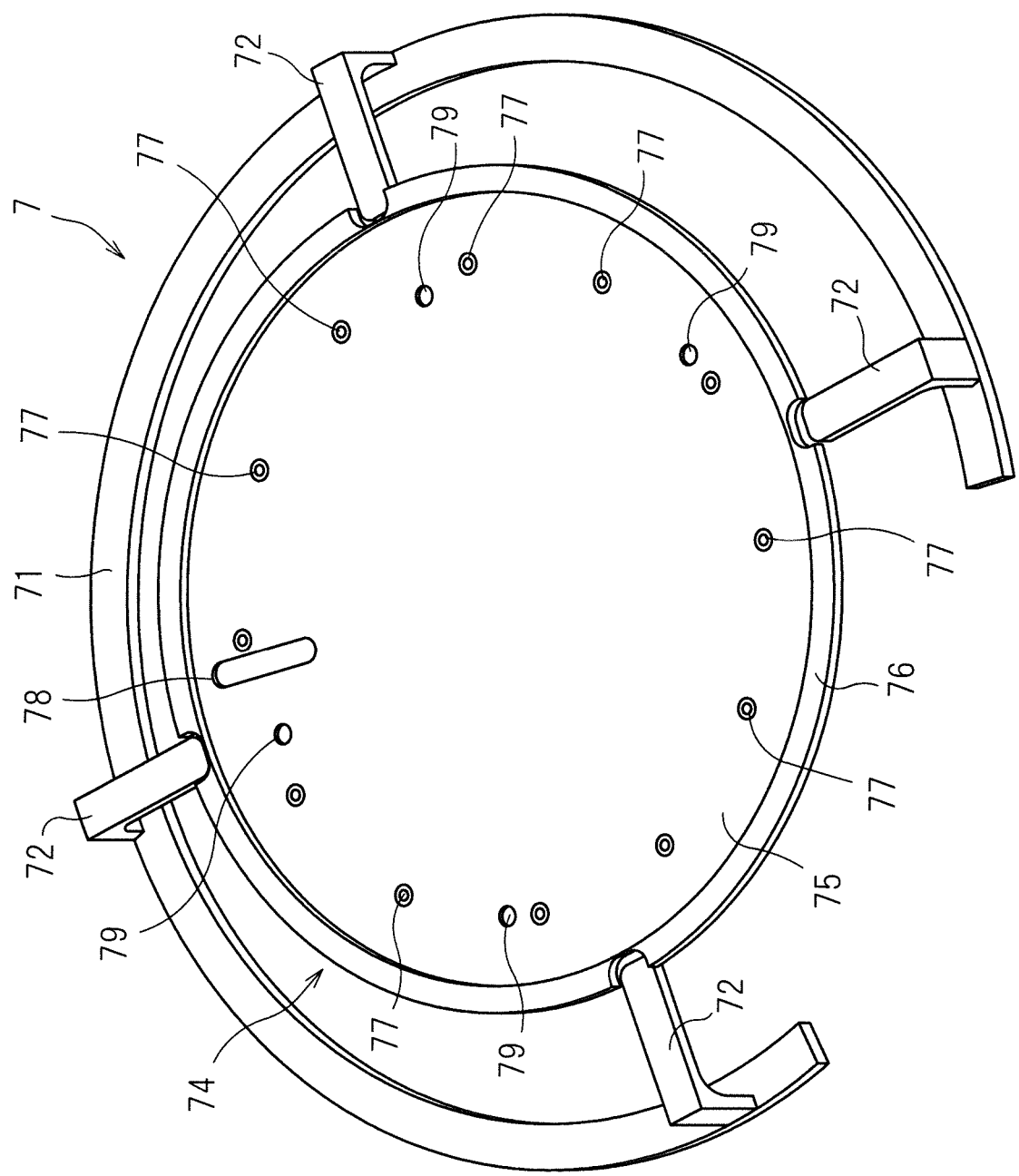
FIG. 2 is a perspective view illustrating the entire external appearance of a holder.

FIG. 2 is a perspective view illustrating the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (refer to FIG. 1). The multiple coupling portions 72 (four coupling portions in the present preferred embodiment) are provided upright on the upper surface of the base ring 71 in a circumferential direction of the annular shape of the base ring 71. The coupling portions 72 are each a quartz member, and are each rigidly secured to the base ring 71 by welding.

Figure 3:
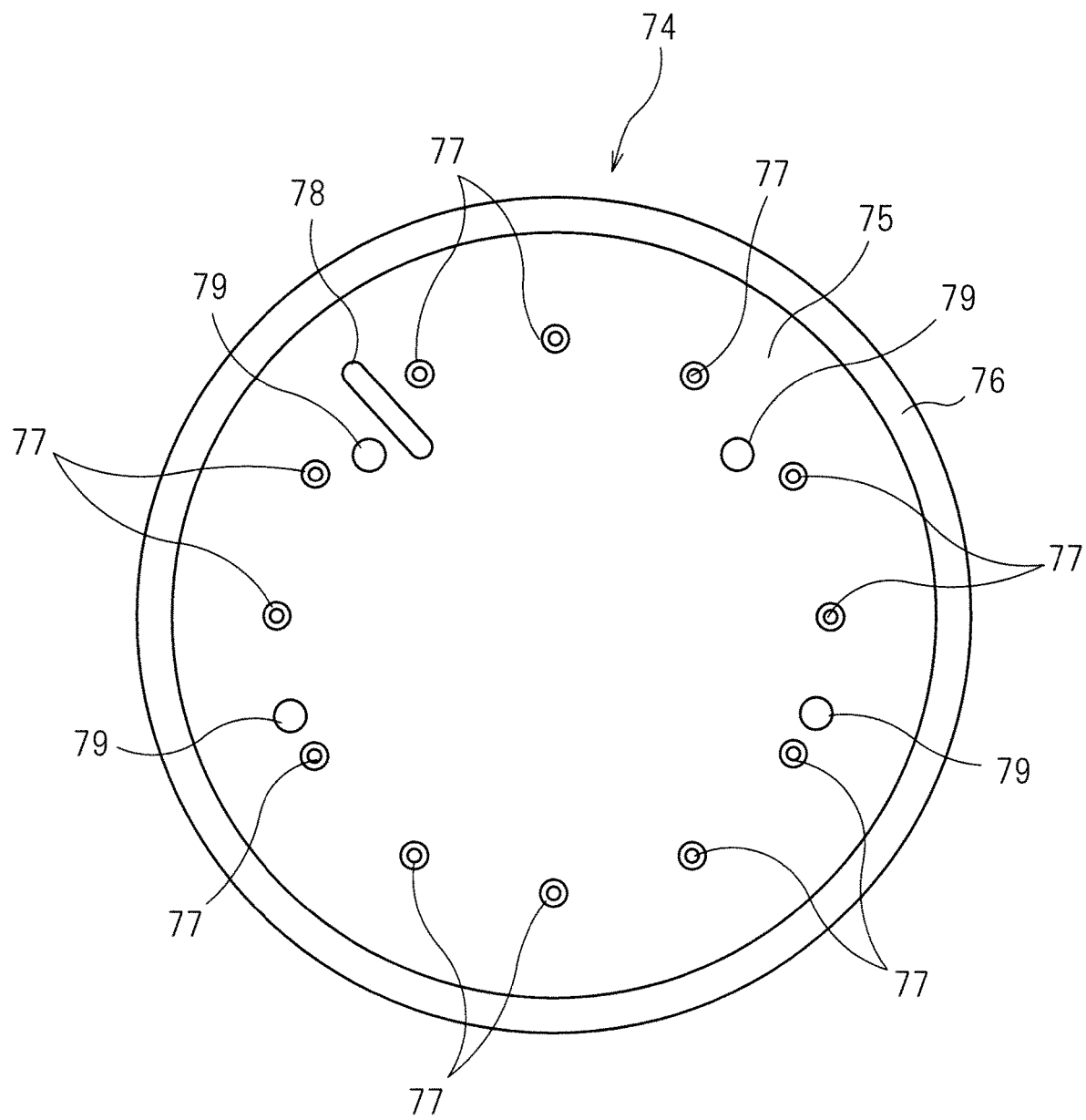
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a substantially circular planar member made of quartz. The holding plate 75 has a diameter greater than that of a semiconductor wafer W. In other words, the holding plate 75 has a planar size greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the semiconductor wafer W has a diameter of 300 mm, the guide ring 76 has an inner diameter of 320 mm. The guide ring 76 has an inner periphery formed in a tapered surface increasing in diameter upward from the holding plate 75. The guide ring 76 is made of quartz similar to that of the holding plate 75. The guide ring 76 may be welded to the upper surface of the holding plate 75, or fixed to the holding plate 75 with pins separately machined or the like. Alternatively, the holding plate 75 and the guide ring 76 may be machined as an integral member.

The upper surface of the holding plate 75 includes a region inside the guide ring 76, serving as a planar holding surface 75a for holding the semiconductor wafer W. The plurality of substrate support pins 77 are provided upright on the holding surface 75a of the holding plate 75. In the present preferred embodiment, a total of 12 substrate support pins 77 are provided upright every 30 degrees along the circumference of a circle concentric with the outer circumference of the holding surface 75a (the inner circumference of the guide ring 76). The 12 substrate support pins 77 are disposed on a circle that has a diameter (a distance between the substrate support pins 77 facing each other) smaller than a diameter of the semiconductor wafer W, and that has a diameter of 270 mm to 280 mm (270 mm in the present preferred embodiment) when the semiconductor wafer W has a diameter of 300 mm. Each of the substrate support pins 77 is made of quartz. The plurality of substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. When the base ring 71 of the holder 7 as described above is supported by the wall surface of the chamber 6, the holder 7 is mounted to the chamber 6. The holder 7 mounted to the chamber 6 causes the holding plate 75 of the susceptor 74 to be a horizontal orientation (an orientation in which the normal line to the holding plate 75 coincides with a vertical direction). In other words, the holding surface 75a of the holding plate 75 is horizontal. A semiconductor wafer W transported into the chamber 6 is placed and held in a horizontal orientation on the susceptor 74 of the holder 7 mounted to the chamber 6. At this time, the semiconductor wafer W is supported by the 12 substrate support pins 77 provided upright on the holding plate 75, and is held by the susceptor 74. More specifically, the 12 substrate support pins 77 have respective upper end portions that come into contact with the lower surface of the semiconductor wafer W to support the semiconductor wafer W. The 12 substrate support pins 77 are uniform in height (distance from an upper end of each of the substrate support pins 77 to the holding surface 75a of the holding plate 75), so that the semiconductor wafer W can be supported in a horizontal orientation by the 12 substrate support pins 77.

The semiconductor wafer W is supported by the plurality of substrate support pins 77 at a predetermined interval from the holding surface 75a of the holding plate 75. The guide ring 76 has a thickness greater than a height of each of the substrate support pins 77. Thus, the guide ring 76 prevents the semiconductor wafer W supported by the substrate support pins 77 from being displaced horizontally.

As illustrated in FIGS. 2 and 3, the holding plate 75 of the susceptor 74 is formed with an opening 78 extending vertically through the holding plate 75. The opening 78 is provided for the radiation thermometer 20 to receive radiation (infrared light) emitted from the lower surface of the semiconductor wafer W. Specifically, the radiation thermometer 20 receives the light emitted from the lower surface of the semiconductor wafer W through the opening 78 and the transparent window 21 mounted to the through hole 61a in the chamber side portion 61 to measure the temperature of the semiconductor wafer W. The holding plate 75 of the susceptor 74 further includes four through holes 79 bored therein through which respective lift pins 12 of the transfer mechanism 10, described later, pass to transfer a semiconductor wafer W.

Figure 5:
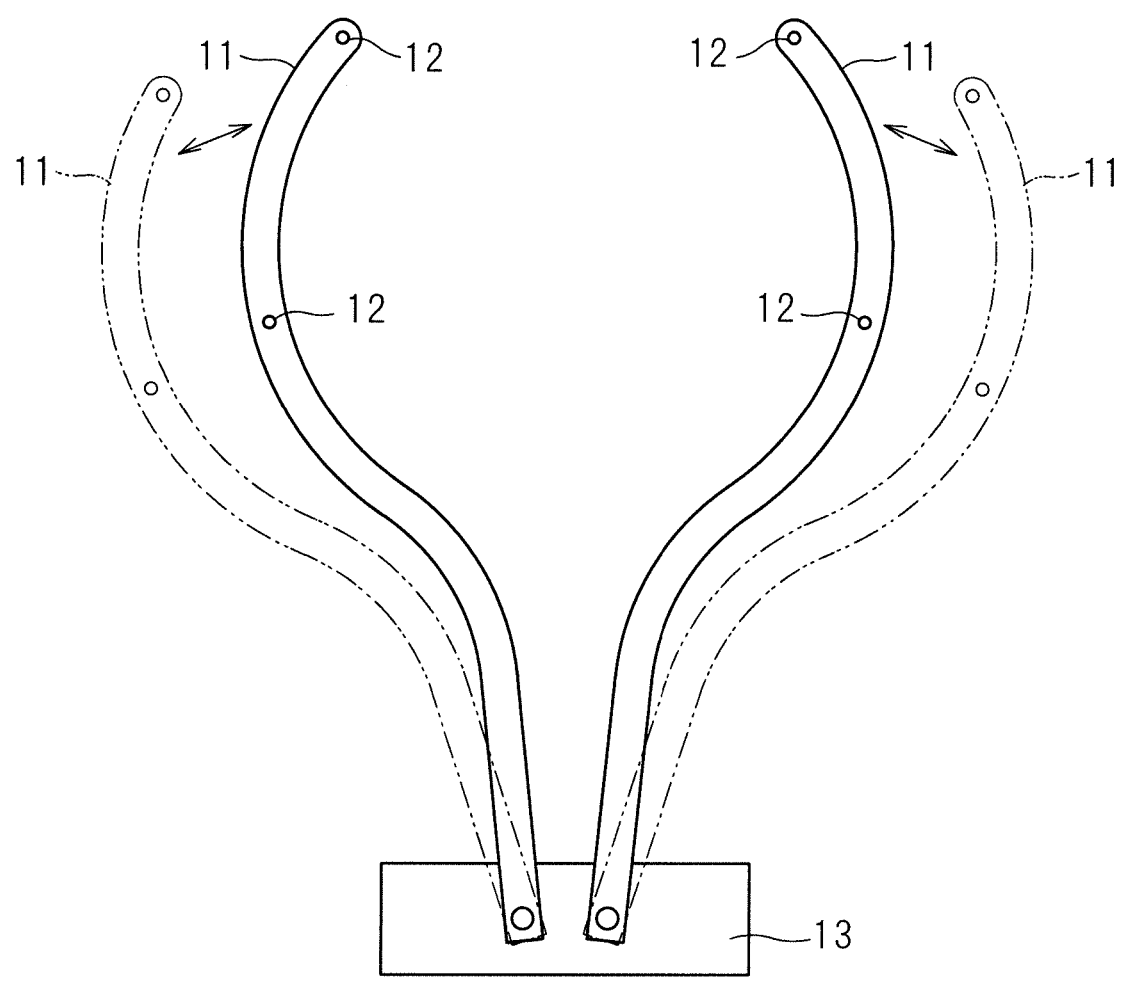
FIG. 5 is a plan view of a transfer mechanism.
Figure 6:
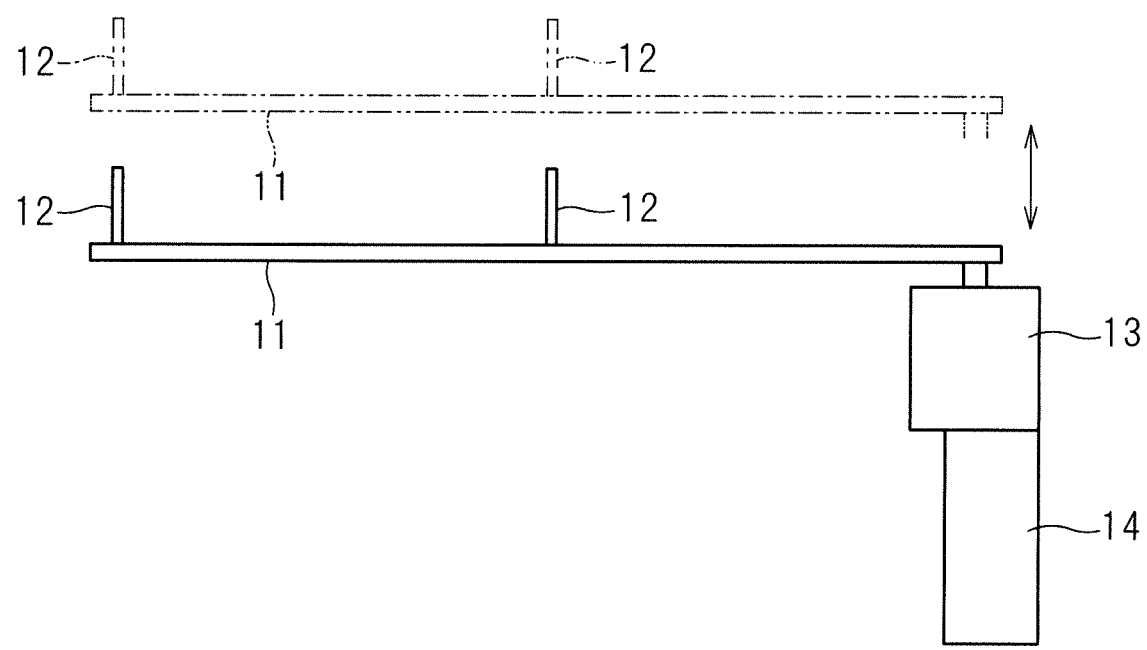
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are each in an arcuate shape substantially along the recessed portion 62 in an annular shape. Each of the transfer arms 11 includes the two lift pins 12 provided upright thereon. The transfer arms 11 and the lift pins 12 are each made of quartz. The transfer arms 11 are each pivotable by a horizontal movement mechanism 13. The horizontal movement mechanism 13 moves the pair of transfer arms 11 horizontally between a transfer operation position (a position indicated with solid lines in FIG. 5) in which a semiconductor wafer W is transferred to and from the holder 7 and a retracted position (a position indicated with dash-double-dot lines in FIG. 5) in which the transfer arms 11 do not overlap the semiconductor wafer W held by the holder 7 in plan view. The horizontal movement mechanism 13 may be configured such that individual motors cause the respective transfer arms 11 to pivot, or may be configured such that a single motor causes the pair of transfer arms 11 to pivot in a linked manner using a linkage mechanism.

The transfer arms 11 are moved upwardly and downwardly together with the horizontal movement mechanism 13 by an elevating mechanism 14. When the elevating mechanism 14 moves up the pair of transfer arms 11 at their transfer operation positions, the four lift pins 12 in total pass through the respective four through holes 79 (refer to FIGS. 2 and 3) bored in the susceptor 74. This allows upper ends of the lift pins 12 to protrude from the upper surface of the susceptor 74. On the other hand, when the elevating mechanism 14 moves down the pair of transfer arms 11 at their transfer operation positions to take the lift pins 12 out of the respective through holes 79 and the horizontal movement mechanism 13 moves the pair of transfer arms 11 so as to open the transfer arms 11, the transfer arms 11 are moved to their retracted positions. The retracted positions of the pair of transfer arms 11 are immediately over the base ring 71 of the holder 7. The retracted positions of the transfer arms 11 are inside the recessed portion 62 because the base ring 71 is placed on the bottom surface of the recessed portion 62. The transfer mechanism 10 includes an exhaust mechanism (not illustrated) that is provided also near portions where drivers (the horizontal movement mechanism 13 and the elevating mechanism 14) are provided so that an atmosphere around the drivers of the transfer mechanism 10 is exhausted to the outside of the chamber 6.

Referring again to FIG. 1, the flash heating part 5 provided over the chamber 6 includes an enclosure 51, a light source provided inside the enclosure 51 and including the multiple (30 in the present preferred embodiment) xenon flash lamps FL, and a reflector 52 provided inside the enclosure 51, covering the light source from above. The flash heating part 5 further includes a lamp light radiation window 53 mounted to the bottom of the enclosure 51. The lamp light radiation window 53 constituting the floor of the flash heating part 5 is a plate-like quartz window made of quartz. When the flash heating part 5 is provided over the chamber 6, the lamp light radiation window 53 faces the upper chamber window 63. The flash lamps FL emit a flash of light from over the chamber 6 through the lamp light radiation window 53 and the upper chamber window 63 into the heat treatment space 65.

The multiple flash lamps FL, each of which is a rod-shaped lamp having an elongated cylindrical shape, are arranged in a plane so that the longitudinal directions of the respective flash lamps FL are parallel to each other along a main surface of a semiconductor wafer W held by the holder 7 (i.e., in a horizontal direction). Thus, a plane defined by the arrangement of the flash lamps FL is also a horizontal plane. A region in which the plurality of flash lamps FL are arranged has a size, as seen in plan view, greater than that of the semiconductor wafer W.

Each of the xenon flash lamps FL includes a cylindrical glass tube (discharge tube) containing xenon gas sealed therein and having positive and negative electrodes provided on opposite ends thereof and connected to a capacitor, and a trigger electrode attached to the outer peripheral surface of the glass tube. The xenon gas is electrically insulative, so that no current flows in the glass tube in a normal state even when electrical charge is accumulated in the capacitor. However, when a high voltage is applied to the trigger electrode to produce a dielectric breakdown, electricity accumulated in the capacitor flows momentarily in the glass tube, and xenon atoms or molecules are excited at this time to cause light emission. Such a xenon flash lamp FL has the property of being capable of emitting extremely intense light as compared with a light source for continuous lighting such as a halogen lamp HL because the electrostatic energy preliminarily accumulated in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source that supplies power to the flash lamps FL.

The reflector 52 is provided over the plurality of flash lamps FL, covering all of the flash lamps FL. The reflector 52 has a fundamental function of reflecting a flash of light emitted from the plurality of flash lamps FL toward the heat treatment space 65. The reflector 52 is formed of an aluminum-alloy plate, and has a front surface (a surface facing the flash lamps FL) that is roughened by blasting.

The halogen heating part 4 provided under the chamber 6 includes an enclosure 41 incorporating the multiple (40 in the present preferred embodiment) halogen lamps HL. The halogen heating part 4 heats the semiconductor wafer W by emitting light from under the chamber 6 through the lower chamber window 64 into the heat treatment space 65 using the halogen lamps HL.

Figure 7:
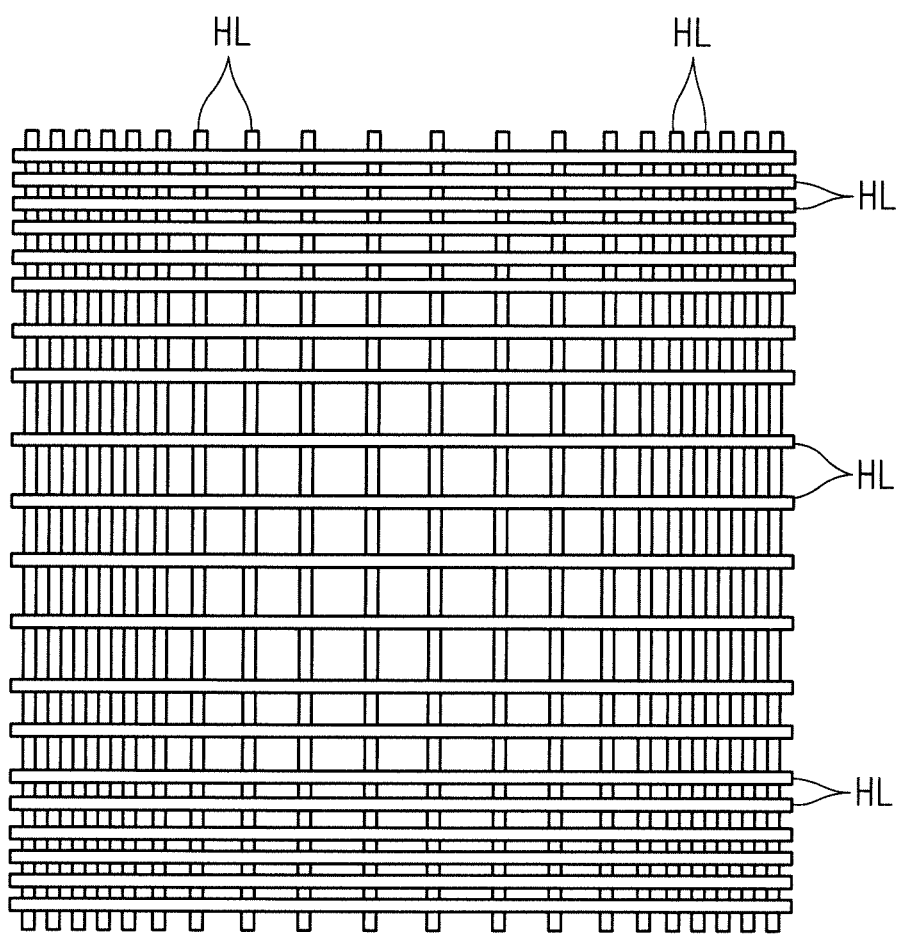
FIG. 7 is a plan view illustrating an arrangement of a plurality of halogen lamps.

FIG. 7 is a plan view illustrating an arrangement of the multiple halogen lamps HL. The 40 halogen lamps HL are arranged in two tiers, i.e., upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are parallel to each other along a main surface of a semiconductor wafer W held by the holder 7 (i.e., in a horizontal direction). Thus, a plane defined by the arrangement of the halogen lamps HL in each of the upper and lower tiers is also a horizontal plane.

As illustrated in FIG. 7, the halogen lamps HL in each of the upper and lower tiers are disposed at a higher density in a region facing a peripheral portion of the semiconductor wafer W held by the holder 7 than in a region facing a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated using light emitted from the halogen heating part 4.

The group of halogen lamps HL in the upper tier and the group of halogen lamps HL in the lower tier are arranged intersecting each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least one second or more. In addition, the halogen lamps HL are rod-shaped lamps and thus have a long life. The arrangement of the halogen lamps HL in a horizontal direction provides good efficiency of radiation toward the semiconductor wafer W provided over the halogen lamps HL.

The enclosure 41 of the halogen heating part 4 is also provided inside with a reflector 43 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

Besides the aforementioned components, the heat treatment apparatus 1 further includes various cooling structures to prevent an excessive temperature increase in the halogen heating part 4, the flash heating part 5, and the chamber 6 due to heat energy generated by the halogen lamps HL and the flash lamps FL during heat treatment of a semiconductor wafer W. For example, a water cooling tube (not illustrated) is provided in walls of the chamber 6. The halogen heating part 4 and the flash heating part 5 also each have an air cooling structure for forming a gas flow therein to exhaust heat. Then, air is also supplied to a gap between the upper chamber window 63 and the lamp light radiation window 53 to cool down the flash heating part 5 and the upper chamber window 63.

Next, treatment operation in the heat treatment apparatus 1 will be described. Here, the heat treatment operation for a normal semiconductor wafer (product wafer) W that becomes a product will be described first, and then cleaning treatment of the chamber 6 of the heat treatment apparatus 1 will be described. The treatment procedure for a semiconductor wafer W, described below, proceeds under control of the controller 3 over each operating mechanism of the heat treatment apparatus 1.

Prior to the treatment of the semiconductor wafer W, the valve 84 for supply of gas is opened, and the valve 89 for exhaust of gas is opened, so that the supply and exhaust of gas into and out of the chamber 6 start. When the valve 84 is opened, nitrogen gas is supplied into the heat treatment space 65 through the gas supply opening 81. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

Subsequently, the gate valve 185 is opened to open the transport opening 66. A transport robot outside the heat treatment apparatus 1 transports a semiconductor wafer W to be treated into the heat treatment space 65 of the chamber 6 through the transport opening 66. At this time, while there is a risk of sucking an atmosphere outside the heat treatment apparatus 1 into the heat treatment space 65 with transport of the semiconductor wafer W into the heat treatment space 65, the nitrogen gas is continuously supplied into the chamber 6. Thus, the nitrogen gas flows outwardly through the transport opening 66 to enable minimizing sucking of the outside atmosphere into the heat treatment space 65 as described above.

The semiconductor wafer W transported into the heat treatment space 65 by the transport robot is moved forward to a position immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal orientation from below. The semiconductor wafer W is supported by the substrate support pins 77 provided upright on the holding plate 75, and is held by the susceptor 74. The semiconductor wafer W is held by the holder 7 such that its front surface subjected to deposition treatment faces upward. A predetermined distance is defined between the back surface (a main surface opposite to the front surface) of the semiconductor wafer W supported by the plurality of substrate support pins 77 and the holding surface 75$a$ of the holding plate 75. The pair of transfer arms 11 moved downwardly below the susceptor 74 is moved back to the retracted position, i.e., to the inside of the recessed portion 62, by the horizontal movement mechanism 13.

After the semiconductor wafer W is held in a horizontal orientation from below by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. Receiving the halogen light emitted from the halogen lamps HL allows the semiconductor wafer W to be preheated, so that the semiconductor wafer W increases in temperature. Then, the transfer arms 11 of the transfer mechanism 10 are retracted to the inside of the recessed portion 62, and thus do not obstruct the heating using the halogen lamps HL.

The radiation thermometer 20 measures temperature of the semiconductor wafer W that is heated by irradiation with light from the halogen lamps HL. The measured temperature of the semiconductor wafer W is transmitted to the controller 3. The controller 3 controls output from the halogen lamps HL while monitoring whether temperature of the semiconductor wafer W, which increases in temperature with light emitted from the halogen lamps HL, reaches a predetermined preheating temperature T1. In other words, the controller 3 effects feedback control of the output from the halogen lamps HL so that the temperature of the semiconductor wafer W becomes the preheating temperature T1, based on the value measured with the radiation thermometer 20.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 20 reaches the preheating temperature T1, the controller 3 adjusts the output from the halogen lamps HL to maintain the temperature of the semiconductor wafer W at approximately the preheating temperature T1.

When preheating is performed using the halogen lamps HL as described above, the entire semiconductor wafer W is uniformly increased in temperature to the preheating temperature T1. In the preheating stage using the halogen lamps HL, while the semiconductor wafer W tends to decrease in temperature more in its peripheral portion where heat is more liable to dissipate than in its central portion, the halogen lamps HL in the halogen heating part 4 are disposed at a higher density in a region facing the peripheral portion of the semiconductor wafer W than in a region facing the central portion thereof. This causes increasing the amount of light impinging on the peripheral portion of the semiconductor wafer W where heat is liable to dissipate, so that in-plane temperature distribution of the semiconductor wafer W in the preheating stage can be uniform.

At the point in time when a predetermined time elapses after temperature of a semiconductor wafer W held on the susceptor 74 reaches the preheating temperature T1, the flash lamps FL of the flash heating part 5 irradiates the front surface of the semiconductor wafer W with a flash of light. At this time, a part of the flash of light emitted from the flash lamps FL travels directly toward the interior of the chamber 6, and a part of the remainder of the flash of light travels toward the interior of the chamber 6 after reflected once from the reflector 52. The irradiation of the semiconductor wafer W with the flash of light described above achieves flash heating of the semiconductor wafer W.

The flash heating is performed with a flash of light emitted from the flash lamps FL, so that the front surface temperature of the semiconductor wafer W can be increased in a short time. Specifically, the flash of light emitted from the flash lamps FL is an intense flash of light that is emitted for an extremely short period of time ranging from about 0.1 to about 100 milliseconds, and that is acquired by converting electrostatic energy preliminarily stored in a capacitor into an ultrashort light pulse. The front surface temperature of the semiconductor wafer W subjected to the flash heating using a flash of light emitted from the flash lamps FL momentarily increases to a treatment temperature T2 of 1000° C. or more, and then decreases rapidly.

After the flash heating treatment is finished, the halogen lamps HL are turned off when a predetermined time elapses. This causes the temperature of the semiconductor wafer W to decrease rapidly from the preheating temperature T1. The radiation thermometer 20 measures the temperature of the semiconductor wafer W during decrease in temperature, and a result of the measurement is transmitted to the controller 3. The controller 3 monitors whether the temperature of the semiconductor wafer W decreases to a predetermined temperature based on the result of the measurement with the radiation thermometer 20. After the temperature of the semiconductor wafer W decreases to the predetermined temperature or below, the pair of transfer arms 11 of the transfer mechanism 10 is moved horizontally again from the retracted position to the transfer operation position and is then moved upwardly. This causes the lift pins 12 to protrude from the upper surface of the susceptor 74 to receive the heat-treated semiconductor wafer W from the susceptor 74. Subsequently, the transport opening 66 having been closed is opened by the gate valve 185, and the transport robot outside the heat treatment apparatus 1 transports the semiconductor wafer W placed on the lift pins 12 from the chamber 6, and then the heating treatment of the semiconductor wafer W is completed.

When a semiconductor wafer W provided on its front surface with a film is preheated, and then subjected to flash heating, dopants and the like may be discharged from the film increased in temperature into the heat treatment space 65 due to outward diffusion. Depending on a type of film, sublimates may be generated from the film increased in temperature. These substances derived from the film (mainly carbon-based substances) adhere to the inner wall surface of the cooled chamber 6 to contaminate the chamber 6. Then, in the present preferred embodiment, the cleaning treatment of the chamber 6 of the heat treatment apparatus 1 is performed as follows.

Figure 8:
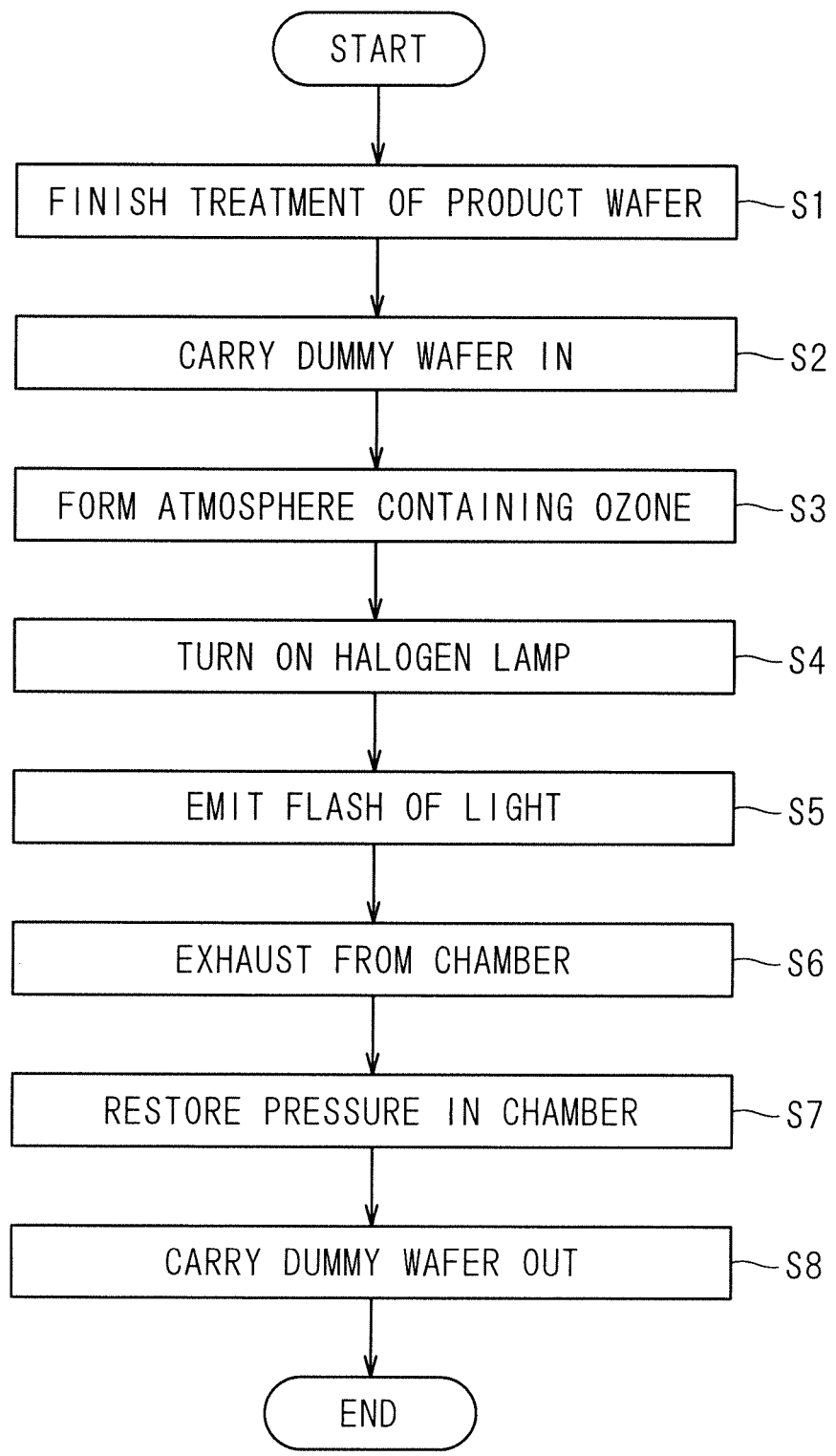
FIG. 8 is a flowchart illustrating a procedure of cleaning treatment of a chamber.

FIG. 8 is a flowchart illustrating a procedure of the cleaning treatment of the chamber 6. After the treatment of the semiconductor wafer W as described above is completed for 25 product wafers, for example (step S1), the heat treatment apparatus 1 enters a standby state, and a dummy wafer is transported into the chamber 6 (step S2). The dummy wafer is a disk-shaped silicon wafer similar to the semiconductor wafer W that becomes a product, and is similar in size and shape to the semiconductor wafer W. However, the dummy wafer is not subjected to pattern formation and deposition treatment. That is, the dummy wafer is a so-called silicon bare wafer. Operation of transporting the dummy wafer into the chamber 6 is the same as the above-described operation of transporting the semiconductor wafer W thereinto.

After the dummy wafer is transported into the chamber 6 and held by the susceptor 74, and the transport opening 66 is closed by the gate valve 185, an atmosphere containing ozone is formed in the chamber 6 (step S3). In the present preferred embodiment, a mixed atmosphere of ozone and oxygen is formed in the chamber 6. Specifically, the treatment gas supply source 85 feeds a mixed gas of ozone and oxygen, and the mixed gas is supplied to the heat treatment space 65 through the gas supply opening 81 as a cleaning gas. When the cleaning gas is supplied through the gas supply opening 81 while gas in the chamber 6 is exhausted through the gas exhaust openings 86, an atmosphere inside the chamber 6 is replaced with a mixed atmosphere of ozone and oxygen.

After the mixed atmosphere of ozone and oxygen is formed in the chamber 6, the halogen lamps HL of the halogen heating part 4 are turned on (step S4). The dummy wafer is held by the susceptor 74, so that light emitted from the halogen lamp HL passes through the lower chamber window 64 and the susceptor 74 to irradiate the lower surface of the dummy wafer. When receiving the light emitted from the halogen lamps HL, the dummy wafer is heated and increased in temperature. Then, the mixed atmosphere of ozone and oxygen in the chamber 6 is also heated by heat conduction from the dummy wafer increased in temperature.

After ambient temperature in the chamber 6 reaches a predetermined temperature with irradiation with light from the halogen lamps HL, the flash lamps FL emit light in a state where an atmosphere containing ozone is formed in the chamber 6, and then a flash of light is emitted into the heat treatment space 65 (step S5). The flash of light is emitted in a time of 0.1 ms or more and 100 ms or less. The flash of light emitted from the flash lamps FL has a spectral distribution extending from an ultraviolet region to a near infrared region. That is, the flash of light emitted from the flash lamps FL is light containing ultraviolet light. The flash lamps FL each include a lamp tube that is preferably made of material allowing ultraviolet light to actively pass through so that the flash of light contains ultraviolet light sufficiently.

When the mixed atmosphere of ozone and oxygen formed in the chamber 6 is irradiated with the flash of light containing ultraviolet light, oxygen molecules are decomposed by the ultraviolet light having a wavelength of about 185 nm, and contaminants adhered to the wall surface of the chamber 6 are also decomposed. Oxygen atoms generated by the decomposition of oxygen molecules combine with other oxygen molecules to generate ozone. In addition, ozone is decomposed by ultraviolet light having a wavelength of about 254 nm to generate active oxygen. The active oxygen and the contaminants react with each other to form carbon monoxide (CO) or carbon dioxide ($CO_2$), so that the contaminants are removed from the inner wall surface of the chamber 6. In this way, the inner wall surface of the chamber 6 is cleaned. At this time, the mixed atmosphere of ozone and oxygen in the chamber 6 is heated by irradiation with light from the halogen lamps HL, so that the decomposition and removal of the contaminants are further promoted.

After the irradiation with a flash of light is finished, the halogen lamps HL are also tuned off. Then, the inside of the chamber 6 is depressurized to less than the atmospheric pressure by exhausting the atmosphere in the chamber 6 through the gas exhaust opening 86 without supplying gas into the chamber 6 (step S6). This causes carbon monoxide and carbon dioxide generated by the reaction between the atmosphere containing ozone and the contaminants to be discharged from the chamber 6.

After the pressure in the chamber 6 is reduced to a predetermined pressure, nitrogen gas is supplied into the chamber 6 through the gas supply opening 81. This causes the pressure in the chamber 6 to be restored to the atmospheric pressure (step S7). At this time, the exhaust from the chamber 6 may be continued or may be stopped.

After the pressure in the chamber 6 is restored by the nitrogen gas, the dummy wafer is transported out of the chamber 6 (step S8). Operation of transporting the dummy wafer out of the chamber 6 is the same as the above-described operation of transporting the semiconductor wafer W out thereof. After the cleaning treatment using one dummy wafer is completed, the same cleaning treatment as described above may be performed using a new dummy wafer. That is, the processing of steps S2 to S8 may be repeated for a plurality (e.g., five) of dummy wafers.

In the present preferred embodiment, after the treatment of the semiconductor wafer W is completed, the flash lamps FL emit a flash of light containing ultraviolet light in a state where an atmosphere containing ozone is formed in the chamber 6. When a flash of light containing ultraviolet light is emitted into the chamber 6 filled with an atmosphere containing ozone, contaminants adhering to the inner wall surface of the chamber 6 can be decomposed and removed. That is, only supplying a cleaning gas containing ozone into the chamber 6 and emitting a flash of light using the flash lamps FL enable contamination in the chamber 6 to be easily and efficiently cleaned. As a result, the number of maintenance operations for cleaning the chamber 6 can be reduced, and a decrease in operation rate of the heat treatment apparatus 1 can be suppressed by reducing downtime of the heat treatment apparatus 1. In addition, the number of particles derived from contamination in the chamber 6 decreases at the time of maintenance, so that startup time of the heat treatment apparatus 1 can be reduced.

Before the flash of light is emitted, the atmosphere in the chamber 6 is heated by irradiation with light from the halogen lamps HL. This causes ozone and the like to be activated to enable decomposition and removal of contaminants to be further promoted.

In the present preferred embodiment, the cleaning treatment of the chamber 6 is performed using a dummy wafer. That is, the atmosphere in the chamber 6 is heated by heat conduction from the dummy wafer increased in temperature by irradiation with light from the halogen lamps HL. The dummy wafer increased in temperature preheats the susceptor 74 as well. Thus, even during the cleaning treatment using the dummy wafer, treatment of a product wafer can be restarted at arbitrary timing. When the dummy wafer is held by the susceptor 74, a flash of light emitted from the flash lamps FL is reflected on the front surface of the dummy wafer and reaches the inner wall surface of the chamber 6 to enable increase in decomposition efficiency of contaminants.

In the cleaning treatment of the chamber 6 using the dummy wafer, heating using the halogen lamps HL and irradiation with a flash of light from the flash lamps FL are performed, which coincide with contents of the heat treatment for a product wafer. Specifically, a heat treatment recipe used when heat treatment is performed on a product wafer coincides with a treatment recipe used when light irradiation treatment is performed on a dummy wafer. The heat treatment recipe is a program that describes a process sequence of the heat treatment and control parameters (e.g., output values of the halogen lamps HL and the flash lamps FL) of various components (e.g., the halogen lamps HL and the flash lamps FL) related to the heat treatment. The light irradiation treatment is performed on a dummy wafer using the treatment recipe coinciding with the heat treatment recipe used when the heat treatment is performed on a product wafer, so that treatment of the product wafer can be started immediately even when the cleaning treatment of the chamber 6 is performed.

While the preferred embodiments according to the present invention are described above, various modifications of the present invention in addition to those described above may be made without departing from the scope and spirit of the present invention. For example, while in the preferred embodiment described above, the cleaning treatment of the chamber 6 is performed using the dummy wafer, the present invention is not limited to this, and thus the cleaning treatment of the chamber 6 may be performed without using the dummy wafer. Specifically, a cleaning gas containing ozone is continuously supplied into the chamber 6 in a state where no substrate is present in the chamber 6 (a state where neither a dummy wafer nor a product wafer is present) without transporting a dummy wafer into the chamber 6, and a flash of light is emitted from the flash lamps FL. In this case, the flash lamps FL repeatedly emits a flash of light at a time interval of one minute, for example. Then, the halogen lamps HL may continuously emit light additionally to directly heat the atmosphere containing ozone in the chamber 6. As with the preferred embodiment described above, even this case allows the ozone to be decomposed by the ultraviolet light contained in the flash of light to generate active oxygen, and the active oxygen and contaminants react with each other to decompose and remove the contaminants from the inner wall surface of the chamber 6. In addition, when the cleaning treatment of the chamber 6 is performed without using a dummy wafer, costs for consuming dummy wafers can be reduced. However, when the cleaning treatment of the chamber 6 is performed using the dummy wafer as in the preferred embodiment described above, the atmosphere in the chamber 6 can be efficiently heated with the dummy wafer. Further, the flash of light emitted from the flash lamps FL is reflected on the front surface of the dummy wafer and reaches the inner wall surface of the chamber 6, so that efficiency of decomposition of the contaminants increases.

Figure 9:
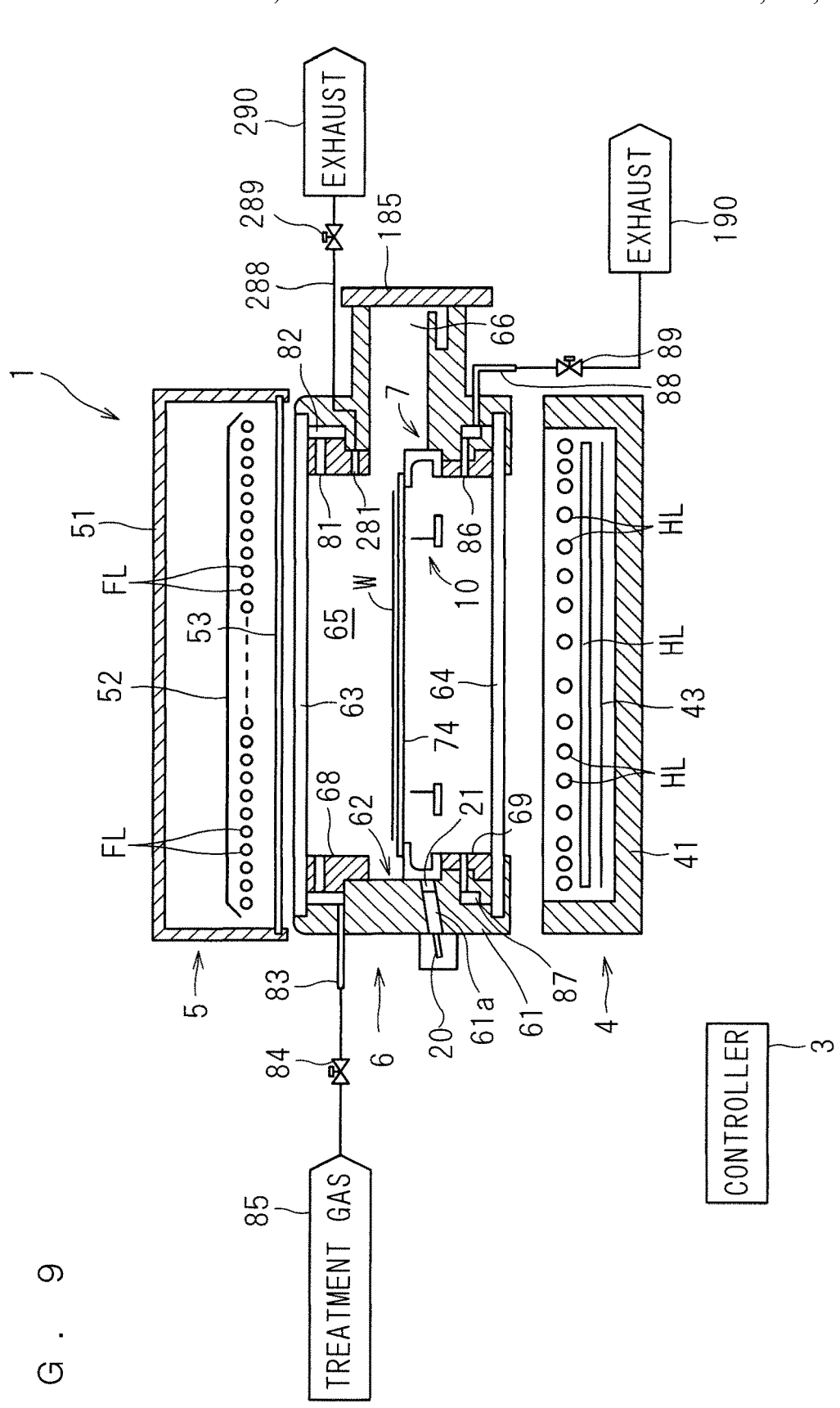
FIG. 9 is a view illustrating another configuration of a heat treatment apparatus.

Then, the exhaust from the chamber 6 after the irradiation with the flash of light may be performed from a space above the susceptor 74. FIG. 9 is a view illustrating another configuration of a heat treatment apparatus 1. In FIG. 9, the same elements as those in the preferred embodiment described above are denoted by the same reference numerals as in FIG. 1. The gas supply opening 81 is provided at a gas supply position above the susceptor 74. Thus, the cleaning gas containing ozone is supplied into the chamber 6 from the gas supply position above the susceptor 74. A gas exhaust opening 281 is provided on the inner wall surface of the chamber 6, at a height position between the susceptor 74 and the gas supply position. The gas exhaust opening 281 is connected to an exhaust part 290 by a gas exhaust pipe 288. The gas exhaust pipe 288 has a path in which a valve 289 is provided midway. When the valve 289 is opened with the exhaust part 290 being operated, the atmosphere in the chamber 6 can be exhausted through the gas exhaust opening 281 provided at the height position between the susceptor 74 and the gas supply position.

The front surface of the semiconductor wafer W is typically formed with various kinds of film, so that contaminants discharged from the film due to heat treatment are likely to adhere to the inner wall surface of the chamber 6 at a position above the semiconductor wafer W, i.e., above the susceptor 74. Thus, carbon monoxide or carbon dioxide generated by decomposition of the contaminants is liable to stay in a space above the susceptor 74. Causing the atmosphere in the chamber 6 to be exhausted from a height position between the susceptor 74 and the gas supply position enables not only the carbon monoxide or carbon dioxide generated by the decomposition of the contaminants to be efficiently discharged out of the chamber 6, but also the gas exhaust pipe 88 serving as an exhaust path during the heat treatment of the semiconductor wafer W to be prevented from being contaminated.

In the structure of FIG. 9, a cleaning gas containing ozone may be supplied in a tornado shape into the chamber 6 through a plurality of gas supply openings 81, and the atmosphere in the chamber 6 may be exhausted in a tornado shape through a plurality of gas exhaust openings 281. In this way, a fresh cleaning gas can be constantly supplied to the inner wall surface of the chamber 6, and the carbon monoxide or carbon dioxide generated by the decomposition of the contaminants can be exhausted from the chamber 6 without residence.

While in the preferred embodiment described above, the cleaning treatment is performed using ultraviolet light contained in a flash of light, a dedicated ultraviolet lamp may be provided separately from the halogen lamps HL and the flash lamps FL. FIG. 10 is a diagram illustrating an example of an arrangement of ultraviolet lamps. In the example of FIG. 10, dedicated ultraviolet lamps UL are provided between corresponding flash lamps FL adjacent to each other arranged in the flash heating part 5. Instead of step S5 in FIG. 8, the ultraviolet lamps UL each emit ultraviolet light into the chamber 6. Even this case allows ozone to be decomposed by the ultraviolet light emitted from each of the ultraviolet lamps UL to generate active oxygen, and the active oxygen and contaminants react with each other to decompose and remove the contaminants from the inner wall surface of the chamber 6. While in the example of FIG. 10, the ultraviolet lamps UL are arranged between the corresponding flash lamps FL, the ultraviolet lamps UL may be arranged between corresponding halogen lamps HL adjacent to each other. The ultraviolet lamps UL are not used when a product wafer is treated.

In the cleaning treatment of the chamber 6, irradiation with light from the halogen lamps HL is not always necessary. When light containing ultraviolet light is emitted into the chamber 6 filled with an atmosphere containing ozone even without irradiating with light from the halogen lamps HL, contaminants adhering to the inner wall surface of the chamber 6 can be decomposed and removed.

While in the preferred embodiment described above, a mixed atmosphere of ozone and oxygen is formed in the chamber 6, an atmosphere of only ozone may be formed. However, the atmosphere of pure ozone is difficult to handle, so that a mixed atmosphere of ozone and oxygen as in the preferred embodiment described above is easier to handle. Instead of ozone, an atmosphere containing a fluorine-based or chlorine-based etching gas such as nitrogen trifluoride, chlorine trifluoride, or chlorine may be formed in the chamber 6.

In addition, software of the controller 3 may be set to form a sequence of performing the cleaning treatment of the preferred embodiment described above at an appropriate timing when a product wafer is not treated. For example, the sequence may be such that the cleaning treatment is performed for two hours every time 1000 product wafers are treated, or the sequence may be such that the cleaning treatment is performed for two hours every ten days.

While the 30 flash lamps FL are provided in the flash heating part 5 in the preferred embodiments described above, the present invention is not limited to this, and any number of flash lamps FL may be provided. The flash lamps FL are not limited to the xenon flash lamps, but may be krypton flash lamps. In addition, the number of halogen lamps HL provided in the halogen heating part 4 is not limited to 40. Any number of halogen lamps HL may be provided.

In the preferred embodiment described above, the filament-type halogen lamps HL are used as continuous lighting lamps that emit light continuously for one second or more to preheat the semiconductor wafer W. The present invention, however, is not limited to this. In place of the halogen lamps HL, discharge type arc lamps (e.g., xenon arc lamps) may be used as the continuous lighting lamps to perform the preheating.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for heating a substrate by irradiating the substrate with light, the heat treatment apparatus comprising:
    a chamber for accommodating a substrate;
    a susceptor for holding said substrate in said chamber;
    a continuous lighting lamp for emitting light into said chamber to heat said substrate held by said susceptor;
    an ultraviolet lamp for emitting light containing ultraviolet light into said chamber;
    a gas supply part for supplying a gas containing ozone into said chamber; and
    an exhaust part for exhausting an atmosphere in said chamber,
    a controller so operable that, while a dummy substrate is held on said susceptor, said ultraviolet lamp emits light containing ultraviolet light, which is reflected on a front surface of said dummy substrate and reaches an inner wall surface of said chamber, into said chamber in which treatment of said substrate is finished and an atmosphere containing ozone is provided,
    said ultraviolet lamp emits light containing ultraviolet light while said continuous lighting lamp heats said atmosphere containing ozone,
    said exhaust part exhausts the atmosphere from said chamber after said ultraviolet lamp emits light containing ultraviolet light,
    said gas supply part supplies a gas containing ozone into said chamber from a gas supply position above said susceptor, and
    said exhaust part exhausts the atmosphere from a height position between said susceptor and said gas supply position.

2. The heat treatment apparatus according to claim 1, wherein
    said gas supply part supplies a mixed gas of ozone and oxygen into said chamber, and
    said ultraviolet lamp emits light containing ultraviolet light into said chamber in which an atmosphere containing ozone and oxygen is provided.

3. The heat treatment apparatus according to claim 1, wherein
    a heat treatment recipe used for treatment of said substrate coincides with a treatment recipe used for ultraviolet light irradiation treatment using said dummy substrate.

4. The heat treatment apparatus according to claim 1, wherein
    said ultraviolet lamp is a flash lamp that emits a flash of light.

5. A method for cleaning a heat treatment apparatus for heating a substrate by irradiating the substrate with light, the method comprising the steps of:
    (a) irradiating a substrate held on a susceptor in a chamber with light to heat said substrate;
    (b) supplying a gas containing ozone into said chamber in which treatment of said substrate is finished;
    (c) allowing an ultraviolet lamp to emit light containing ultraviolet light into said chamber in which an atmosphere containing ozone is provided; and
    (d) exhausting the atmosphere from said chamber after said ultraviolet lamp emits light containing ultraviolet light,
    wherein said ultraviolet lamp emits light containing ultraviolet light while a continuous lighting lamp emits light into said chamber to heat said atmosphere containing ozone,
    in said step (b), a gas containing ozone is supplied into said chamber from a gas supply position above said susceptor,
    in said step (c), said ultraviolet lamp emits light containing ultraviolet light, in said chamber in which a dummy substrate is held on said susceptor, which is reflected on a front surface of said dummy substrate and reaches an inner wall surface of said chamber, and in said step (d), the atmosphere is exhausted from a height position between said susceptor and said gas supply position.

6. The method for cleaning a heat treatment apparatus according to claim 5, wherein in said step (b), a mixed gas of ozone and oxygen is supplied into said chamber, and in said step (c), said ultraviolet lamp emits light containing ultraviolet light into said chamber in which an atmosphere containing ozone and oxygen is provided.

7. The method for cleaning a heat treatment apparatus according to claim 5, wherein a heat treatment recipe used for treatment of said substrate in said step (a) coincides with a treatment recipe used for treatment of said dummy substrate in said step (c).

8. The method for cleaning a heat treatment apparatus according to claim 5, wherein said ultraviolet lamp is a flash lamp that emits a flash of light.

\* \* \* \* \*